(12) United States Patent
Harrand et al.

(10) Patent No.: US 6,215,706 B1
(45) Date of Patent: Apr. 10, 2001

(54) FAST STRUCTURE DRAM

(75) Inventors: Michel Harrand, Saint Egrève; Richard Ferrant, Saint Ismier, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/276,603

(22) Filed: Mar. 25, 1999

(30) Foreign Application Priority Data

Mar. 26, 1998 (FR) .................................................. 98 04008

(51) Int. Cl.[7] .................................................. G11C 07/00
(52) U.S. Cl. .................................. 365/189.05; 365/230.08; 365/230.03
(58) Field of Search .............................. 365/189.05, 235, 365/230.03, 230.08

(56) References Cited

U.S. PATENT DOCUMENTS 4,422,160 * 12/1983 Watanabe .............................. 365/235

* cited by examiner

*Primary Examiner*—Terell W. Fears
(74) *Attorney, Agent, or Firm*—Wolf, Greenfield & Sacks, P.C.; James H. Morris; Theodore E. Galanthay

(57) ABSTRACT

The present invention relates to a DRAM circuit including a plurality of memory cells organized in an array, including switches for associating with each end of each column of the array at least two latches controlled independently from each other to store data written into or read from the considered column.

8 Claims, 3 Drawing Sheets

FAST STRUCTURE DRAM

BACKGROUND OF THE INVENTION

1. Field of the Invention

The present invention relates to memories made in the form of an array of memory cells in an integrated circuit. The present invention more specifically applies to DRAMs, that is, memories requiring a periodic refresh of the data contained by the cells.

2. Discussion of the Related Art

In this type of memories, the content of a memory cell can disappear for two reasons. On the one hand, with time, the content of the cell disappears because of leaks due to the very structure of the memory cell including a transistor which, even in the off-state, leaks slightly. On the other hand, upon each reading of a memory cell, the signal is given by a sharing of charges between a bit line stray capacitance and the storage capacitance of the memory cell. By this charge sharing, the value of the voltage in the memory cell is reduced with respect to the initially contained value.

The two above effects, which result in a loss of information in the memory cells, require two types of precautions.

First, it is necessary to organize a periodic access to each of the memory cells, to compensate the charge losses in the course of time.

Then, it is necessary to restore the initial value of the memory cell upon each access by amplifying the information of the bit line. These two precautions form a so-called refresh/restore operation.

A disadvantage induced by refresh operations is that they adversely affect the general performance of the memory by monopolizing cycles of access thereto.

Assuming, as a specific example, that a memory cell has a holding time of its content of approximately one millisecond, it is then necessary to refresh each cell every millisecond. This refreshing is performed by reading the cells. In practice, all the cells in a row are read in a same cycle, to refresh the entire row. Assuming that the memory is formed of a network of 1024×1024 cells, a refresh cycle then has to be provided every microsecond. If the access time to a cell is approximately 100 nanoseconds, 10% of the memory capacity is lost to refreshing.

A first known solution to solve this type of problem is to increase the holding time inside the memory cells. This solution is, however, difficult to implement and is linked to the memory manufacturing process. Further, it only shifts the problem by one scaling factor.

A second conventional solution is to share the memory in two alternately operating areas. For each new read or write address, the memory changes, the other memory then being available for refresh. Such an interlaced operation solution has a double drawback. First, this solution requires, for a given storage capacity, a memory which is twice as large, which increases the cost as well as the space required. Further, this solution requires a specific program, to manage the interlaced addresses.

SUMMARY OF THE INVENTION

The present invention aims at overcoming the disadvantages of known solutions by providing a novel solution that reduces the waiting delays linked to the refresh, to the reading or to the writing of DRAMs.

The present invention also aims at accelerating the data read and write accesses in the memory.

To achieve these and other objects, the present invention provides a DRAM circuit including a plurality of memory cells organized in an array, and including switches for associating with each end of each column of the array, at least two latches controlled independently from each other to store data written into or read from the considered column.

According to an embodiment of the present invention, the latches are gathered in two pairs of sets, each set being associated with a register for storing the row address of the data contained in this latch set.

According to an embodiment of the present invention, the two pairs of sets of latches are respectively associated with a first and a second pair of input/output lines adapted to being separately connected to a first and to a second input/output terminal of the memory circuit.

According to an embodiment of the present invention, the memory circuit is provided so that the access to the array for a latch set is performed simultaneously for all latches in the set.

According to an embodiment of the present invention, the memory circuit is provided so that the access to the data contained in a latch set from outside the circuit is performed individually, each latch in a same set being individually selected by a memory cell column addressing signal.

According to an embodiment of the present invention, the memory circuit includes, associated with each latch set, a comparator of the address contained in the associated address register, with an address provided by a row address bus.

According to an embodiment of the present invention, the memory circuit includes a first plurality of read amplifiers each arranged between a first respective switch and said at least two latches associated therewith, and a second plurality of read amplifiers each arranged between a second respective switch and said at least two latches associated therewith.

According to an embodiment of the present invention, the memory circuit includes a state machine adapted to successively address the different rows of the array.

According to an embodiment of the present invention, the first and second input/output terminals of the memory circuit are interconnected.

The foregoing objects, features and advantages of the present invention, will be discussed in detail in the following non-limiting description of specific embodiments in connection with the accompanying drawings.

DETAILED DESCRIPTION

Figure 1A:
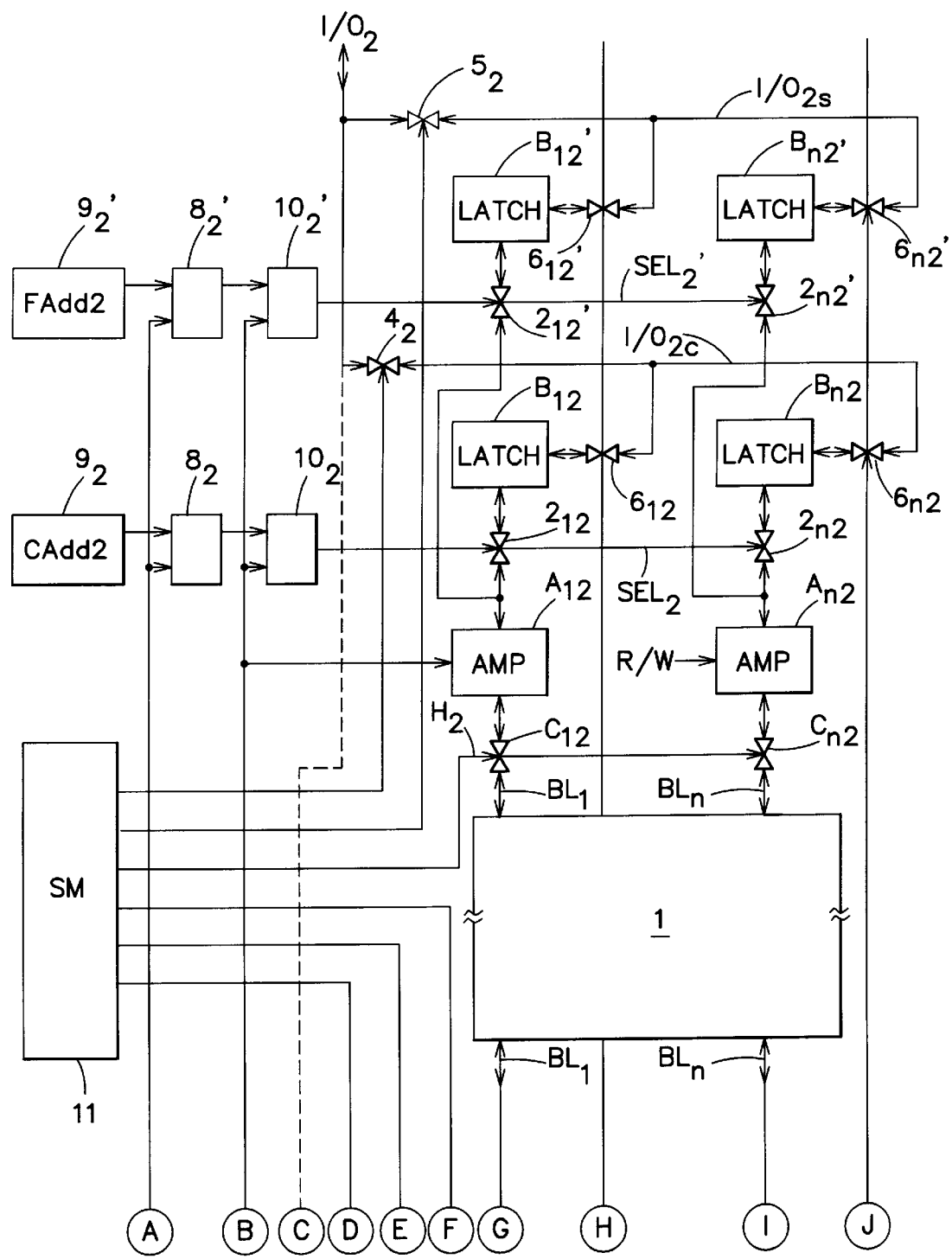
FIGS. 1A and 1B partially shows an embodiment of a DRAM circuit according to the present invention.

The same elements have been referred to with the same references in the different drawings. For clarity, only those elements necessary to the understanding of the present invention have been shown in the drawings and will be described hereafter.

In FIG. 1, a DRAM circuit according to the present invention is includes a memory cell network 1 containing several individual memory cells (not shown). Each memory cell generally includes a transistor and a capacitor. The memory cells are typically organized in an array of rows and columns. Each memory cell is connected to a bit line (or column) BL generally including a pair of complementary lines (a direct bit line $BL_d$ and a complementary so-called "reference bit line" $BL_r$) and to a word line or row (not shown). The logic state of the data signal present on the bit line is determined by the charge level of the capacitor of the corresponding cell.

A DRAM generally includes several arrays 1. Each array comprises row decoders (not shown) for determining, from a read or write address, the addressed word or row of the array. Each network also is associated with column decoders for decoding the addresses to determine the addressed bit line. Each column comprises a bit line BL.

Figure 1B:
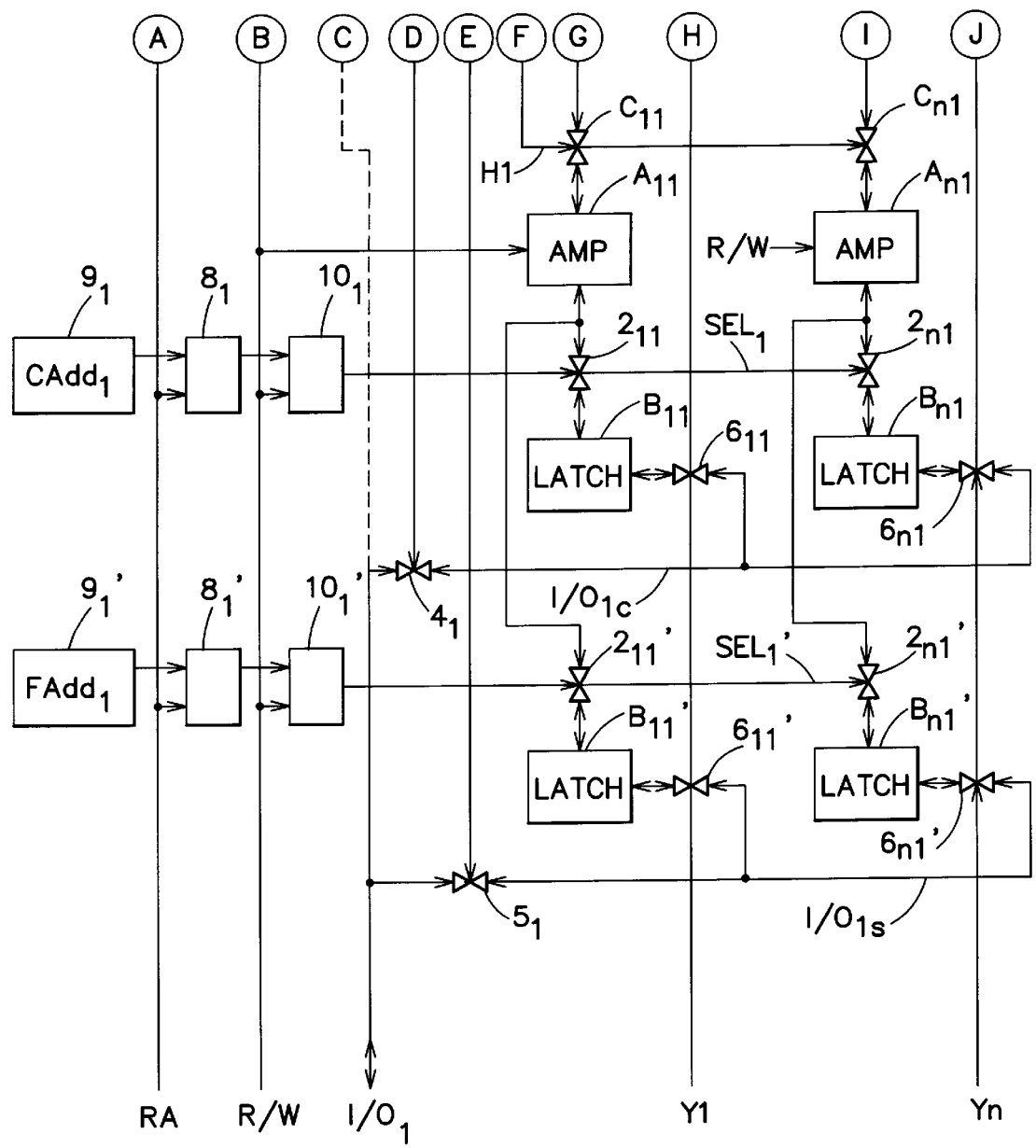

To simplify, a single memory cell array having n columns will be considered hereafter (FIGS. 1A and 1B). The elements which will be described in relation with this array 1 are, of course, reproduced on the other possible arrays of the memory circuit.

According to the present invention, each column i, i being included between 1 and n, is associated with four latches $B_{i1}$, $B_i1'$ and $B_i2$, $B_i2'$ for temporarily storing read data or data to be written.

In a conventional memory circuit, read amplifiers $A_1, \ldots, A_n$, the number of which corresponds to the number of bit lines BL of network 1, are interposed between bit lines BL and input/output terminals I/O of the memory circuit. Additional preamplifiers may be interposed between the read amplifiers and these input/output terminals. It should be noted that amplifiers $A_1, \ldots, A_n$ are bidirectional and are also used during the writing of data into each column. They are also used to accelerate the latch operation, as would preamplifiers of a conventional circuit.

According to an embodiment of the present invention illustrated by FIGS. 1A and 1B, each end of each bit line $BL_i$ of array 1 is connected to an input/output terminal I/O ($I/O_1$ for the lower end and $I/O_2$ for the upper end) by an amplifier $A_i$ ($A_i1$ for the lower end and $A_i2$ for the upper end). Terminals $I/O_1$ and $I/O_2$ will normally be confounded, as has been shown in dotted lines in FIGS. 1A and 1B, or maintained distinct to form a dual access memory. Indexes 1 and 2 appearing in FIGS. 1A and 1B respectively designate the elements connected to the lower portion and to the upper portion of a bit line. Amplifier $A_i$ is connected to two latches $B_i$ and $B_i'$ connected in parallel. Thus, latches $B_i$ and $B_i'$ form around array 1 four sets of latches $B_{i1}$, $B_i1'$, $B_i2$ and $B_i2'$. A switch $C_i$ is interposed between the amplifier and the bit line. The switch is controlled by a signal H which will be described hereafter. A switch $2_i$ or $2_i'$ is interposed between the amplifier and latch $B_i$ or $B_i'$ to enable the selection of the latch meant to temporarily store the bit associated with the column.

As will be seen hereafter, the latches have the same structure as the read amplifiers, so that amplifiers $A_i$ may be omitted in certain conditions. Switching elements $2_i$ of columns i are simultaneously controlled by a signal SEL which will be described hereafter. Similarly, switching elements $2_i'$ of columns i are simultaneously controlled by a signal SEL' which will be described hereafter.

Further, each latch $B_i$ is connected to an input/output terminal I/O ($I/O_1$, $I/O_2$) by an intermediary line $I/O_C$ ($I/O_1C$, $I/O_2C$) and each latch $B_i'$ is connected to an input/output line I/O ($I/O_1$, $I/O_2$) by an intermediary line $I/O_s$ ($I/O_1s$, $I/O_2s$). The selection of the line $I/O_c$ or $I/O_s$ to be connected to line I/O is performed by means of a switching element 4 ($4_1$, $4_2$) or 5 ($5_1$, $5_2$). Switching elements 4, 5, are controlled by a state machine 11 (SM), the operation of which will be described hereafter.

Latches $B_{i1}$ are connected to lines $I/O_1c$ via switching elements $6_i1$ controlled by a conventional column selection signal $Y_i$. Similarly, latches $B_i1'$ are connected to lines $I/O_1s$ via switching elements $6_{i1}'$ controlled by column selection signal $Y_i$. Latches $B_{i2}$ and $B_i2'$ are similarly connected to lines $I/O_2c$ and $I/O_2s$ via switching elements $6_i2$, $6_i2'$ controlled by signal $Y_i$. As is conventional in the operation of a memory circuit, a single column selection signal $Y_i$ is active at a given time to select a column of the array.

It should thus be noted that if the access to the data of latches $B_{i1}$ and $B_i1'$ from input/output terminal $I/O_1$ is performed column by column by means of column addressing signals $Y_i$, the writing or the reading of the data of a set of these latches from the read amplifiers is simultaneous for all the columns of a same row.

According to the present invention, the four latch sets $B_{i1}$, $B_i1'$, $B_i2$ and $B_i2'$ are meant to be alternately selected, each for read/write operations on different rows of the array.

Each signal $SEL_1$, $SEL_1'$, $SEL_2$, $SEL_2'$ is obtained from a row address which is present on a bus RA of row addresses coming from the outside or from a circuit (not shown) of generation of this address for a refresh, a writing or a reading. The address present on bus RA is sent onto first inputs of four comparators $8_1$, $8_1'$, $8_2$, $8_2'$ respectively associated with latch sets $B_i1$, $B_i1'$, $B_i2$ and $B_i2'$. The second inputs of comparators $8_1$, $8_1'$, $8_2$, $8_2'$ respectively receive an address CAdd1, FAdd1, CAdd2, FAdd2 stored in registers $9_1$, $9_1'$, $9_2$, $9_2'$ meant to contain the row address corresponding to the data temporarily stored in latches $B_{i1}$, $B_i1'$, $B_i2$, $B_i2'$. The writing of the row address into registers $9_1$, $9_1'$, $9_2$, $9_2'$ is performed at the same time as the temporary storage of the corresponding data into latches $B_{i1}$, $B_i1'$, $B_i2$, $B_i2'$. The organization of this row address writing into registers $9_1$, $9_1'$, $9_2$, $9_2'$ is within the abilities of those skilled in the art.

Comparators $8_1$, $8_1'$, $8_2$, and $8_2'$ each issue a two-state signal, indicative of the result of the comparison between the address present on bus RA and the address stored in registers $9_1$, $9_1'$, $9_2$, and $9_2'$. These signals are respectively combined by a logic element $10_1$, $10_1'$, $10_2$, $10_2'$ with a signal R/W indicative of a read or write operation to activate or deactivate switching elements $2_{i1}$, $2_{i1}'$, $2_i2$, $2_i2'$. It should be noted that registers 9 always contain values which will correspond either to real addresses, or to meaningless remnant values. An enable bit (not shown) generated by state machine 11 will thus be used to enable or disable the content of registers 9.

The memory circuit of the present invention requires, like a conventional memory, a periodical refresh of the content of the memory cells. For this purpose, the circuit is associated with a mechanism of refresh address generation (not shown), for example, a conventional refresh state machine. This state machine generates internal row address signals for refreshing the data signals stored in the memory cells. The refresh state machine provides its addresses to a selector (not shown) for selecting a row address from among the internal row addresses provided for the refresh and the external row addresses provided for a read/write operation, for example, under control of a program. The internal row addresses provided by the refresh state machine are independent from the memory architecture. Attention will be paid to having the refresh state machine provide all the row addresses during a refresh period.

In operation, the selector (for example, a multiplexer) transmits an external row address by means of a row decoding during a write operation. During a read operation, the selector transmits either the internal row address provided by the refresh state machine, or the external row address. The control according to the operation to be performed is conventional.

According to the present invention, the current row address provided by the selector is also sent onto bus RA. State machine 11 is used, among other uses, to provide on bus RA the next row address and to organize the address storage in registers $9_1$, $9_1'$, $9_2$, and $9_2'$. The definition of the position of the next and preceding addresses is linked to the array organization and to how the memory is used. These may for example be addresses which are consecutive physically or in time.

The function of a signal H ($H_1$ or $H_2$) is to isolate the corresponding write/read structure formed by amplifier A and latches B and B'. When signal H is activated, it is possible, through amplifier A, to read data from the column and store it in latch B or B', or to write in the column the data stored in latch B or B'. When signal H is deactivated, amplifier A is isolated from the column.

The function of signals SEL and SEL' is to activate or deactivate the corresponding latch B or B'. When activated, latch B or B' loads data, for example, coming from read amplifier A. When deactivated, latch B or B' is isolated from read amplifier A.

Signal $H_1$ is assumed to be active, and signal $H_2$ is assumed to be inactive. Only the first write/read structure is selected, the second one is isolated from memory array 1.

In the read mode, upon addressing of a current row by means of bus RA, the content of the entire current addressed row is transferred into first latch set $B_1$. In this phase, the row addresses respectively available in register $9_1$ and over bus RA are identical, since they are simultaneously determined by the same means. Signal $SEL_1$ then selects first latch set $B_1$. Switching elements $2_1$ are on, preferably, only during the period necessary for the data storage into latches $B_1$, that is, generally one clock cycle. By this intermediary storage, the row decoder and read amplifiers $A_1$ are available and may be used for other purposes, for example, to refresh the memory array during the reading by rows, column after column (in other words, by page), of the data contained in the first latch set.

Further, as soon as the data in the current row have been transferred to latches $B_1$, state machine 11 can generate, on bus RA, the next row address in memory array 1. This read addressing causes he copying of the content of the memory cells of this next row into second latch set $B_1'$, address $FAdd_1$ of register $9_1'$ then being identical to the row address present on bus RA.

Similarly, as soon as the data in the next row have been transferred to latches $B_1'$, state machine 11 can deactivate $H_1$, activate $H_2$, and generate on bus RA the preceding row address in memory array 1. This read addressing causes the copying of the content of the memory cells of this preceding row into first latch set $B_2$, address $CAdd_2$ of register $9_2$ then being identical to the row address present on bus RA.

During the reading by page of the data of the first row stored in latch set $B_1$, switching elements $2_1$ are off, to isolate latches $B_1$ from the read amplifiers. Switching elements $4_1$ are on, to assign input/output line $I/O_c$ to input/output terminal I/O. Switching elements $6_1$ of the different columns i are successively turned on by the column selection performed by signals $Y_i$. During this period of row reading, switching elements $5_1$, $4_2$ and $5_2$ are off, to isolate the outputs of the latches of sets $B_1'$, $B_2$, and $B_2'$ from input/output terminals $I/O_1$ and $I/O_2$ of the memory circuit.

As the next row is copied into latches $B_1'$, switching elements $2_1'$ are on only during the period necessary for this storage, that is, generally one clock cycle. Similarly, as the next row is copied into latches $B_2$, switching elements $2_2$ are on only during the necessary period.

The information contained in latch sets $B_1'$ and $B_2$ is accordingly immediately available as soon as the corresponding row is addressed. Latch set $B_1'$ or $B_2$ automatically becomes the current latch set and latch sets $B_1$ and $B_2'$ then become the latch sets meant to store the data of the next and preceding rows.

If the next external address does not correspond to the row addresses stored in registers $9_1'$ and $9_2$, the reading is performed conventionally by the addressing of rows of the memory cells and, in this case, the presence of the register does not bring any time gain.

If the next external read address corresponds to the address stored in register $9_1'$ or $9_2$, the address concordance is automatically detected by means of comparator $8_1'$ or $8_2$ and enables immediate access to the data contained in latch set $B_1'$ or $B_2$ which are then read by page, as in the first reading.

It should be noted that a read operation in a latch B does not require, like a read operation in a column, to load long metal tracks such as the bit lines, and that it is thus much faster. According to the present invention, a considerable time gain is obtained by copying, in a single access to the memory array, the data of a row into a set of registers, then by very quickly reading the data from each register in the set, rather than performing according to the state of the art as many accesses to the memory array as readings are desired to be made.

Referring again to the case of write/read operations, the first write/read structure ($A_{i1}$, $B_i1$, $B_i1'$) being selected by signal $H_1$. Upon selection of latches $B_1$ (or $B_1'$) via signal $SEL_1$ (or SEL $_1'$), the data, which are provided by the read amplifier, are stored in the corresponding latches.

State machine 11 is provided so that signal $SEL_1$ or $SEL_1'$ does not remain in the selection state for more than one or a few clock cycles. Accordingly, the read amplifier of the selected structure is isolated from the considered latch $B_1$ or $B_1'$. During the page reading of the copy of the data stored in latches $B_1$ or $B_1'$, a refresh phase can be started by means of the refresh state machine, or the second write/read structure ($A_{i2}$, $B_i2$, $B_i2'$) may be selected to store data in latches $B_2$ or $B_2'$. During a refresh phase, the row addresses previously available on the row decoders are replaced with row addresses internally generated by the refresh state machine. The external row addresses of course remain in address registers $9_1$, $9_1'$, $9_2$ or $9_2'$ in case of a write operation. The refresh state machine thus generates the different row addresses to synchronize the accesses meant for the refresh.

During a write operation, if the address of the row in which it is desired to write is not contained in one of registers $9_1$, $9_1'$, $9_2$ or $9_2'$, the operation is a conventional write operation and the address has to be present in the row decoder to enable the storage of the new data in the memory cells involved. The refresh state machine, as well as state machine 11 of control of latch sets B and B', are deactivated during these conventional write phases.

If, however, the address of the row in which it is desired to write is contained in one of registers $9_1$, $9_1'$, $9_2$ or $9_2'$, it is then possible to store the new data in the latch set $B_1$, $B_1'$, $B_2$, $B_2'$ corresponding to the desired row, then to write in a single operation the content of this latch set in the desired row of memory array 1. It should be noted that this row writing operation is performed in parallel on all columns of memory array 1, and that it takes no longer than a conventional write operation in a single column. Besides, a write operation in a latch B does not require, like a read operation in a column, to load long metal tracks, such as the bit lines, and it is thus much faster.

According to the present invention, a considerable time gain is achieved by very rapidly performing writings in a set of registers corresponding to a row, then by writing the row in a single delayed access to the memory array, rather than performing according to the state of the art as many accesses to the memory array than writings are desired to be performed.

When a writing is desired to be performed in the memory array by means of an amplifier A, the latter is set to the write mode, at a so-called pre-load voltage level. The amplifier is selected at a predetermined time before the write operation to leave time enough thereto to reach this voltage level. According to the present invention, if a set of amplifiers $A_1$ of one of the write/read structures is selected in preparation of a writing and is made unavailable for any other use, this structure is isolated from the memory array and the other write/read structure is connected to the memory array, for example, to perform a refresh operation therein. This characteristic enables the refresh state machine to operate without the constraint associated with the unavailability of the amplifiers before a writing.

The fact of only writing into the registers, and not directly into the memory array, frees the amplifiers for other tasks, like a refresh, writings in other registers, or from other registers. This enables very rapidly writing into a set of registers, and postponing to a subsequent time, that is, when the amplifiers are available again, the writing of the data contained in the set of registers into the corresponding row of the array.

As previously mentioned, three sets of registers respectively containing the data of a current row, of a next row and of a preceding row are permanently available. It is thus possible according to the present invention to have access at any time to several words stored in the memory (this is called a high burst depth). This provides great flexibility in the memory organization and management.

It should be noted that it is possible to provide a greater number of circularly-controlled latch sets, if it is desired to be able to temporarily store a greater number of memory cells. The number of latch sets depends on the application and on the desired reading rate, as well as on a compromise to be accepted between improving the performances and increasing the complexity and surface.

It should also be noted that although, in most cases, the next and preceding addresses are the current address plus or minus 1, state machine 11 may also be provided so that the next address corresponds to an interval higher than 1. The choice of such an interval may correspond to specific applications in which, statistically, the addresses consecutively used are different by a number higher than 1.

An advantage of the present invention is that by providing two write/read structures for temporarily storing the data read from or to be written into the memory, the refresh operation may occur during the data exchange with the outside of the memory.

Another advantage of the present invention is that by providing several temporary storage latches per column, and by associating these latches with row address registers, it is possible to considerably accelerate the reading and the writing of data in the memory array. The present invention takes advantage of the fact that, in most programs, the processed addresses correspond to consecutive memory addresses. Statistically, this is true to almost 100% for the addressing of a video memory, and to approximately 80% for the other applications. The waiting delays associated with the memory refresh are thus considerably reduced and the memory access times are statistically reduced.

Another advantage of the present invention is that it only very slightly increases the bulk of the memory circuit. It can be considered that the memory circuit size increase is on the order of $\frac{1}{500}$-th, which is a low price to pay for the advantages provided by the present invention.

Figure 2:
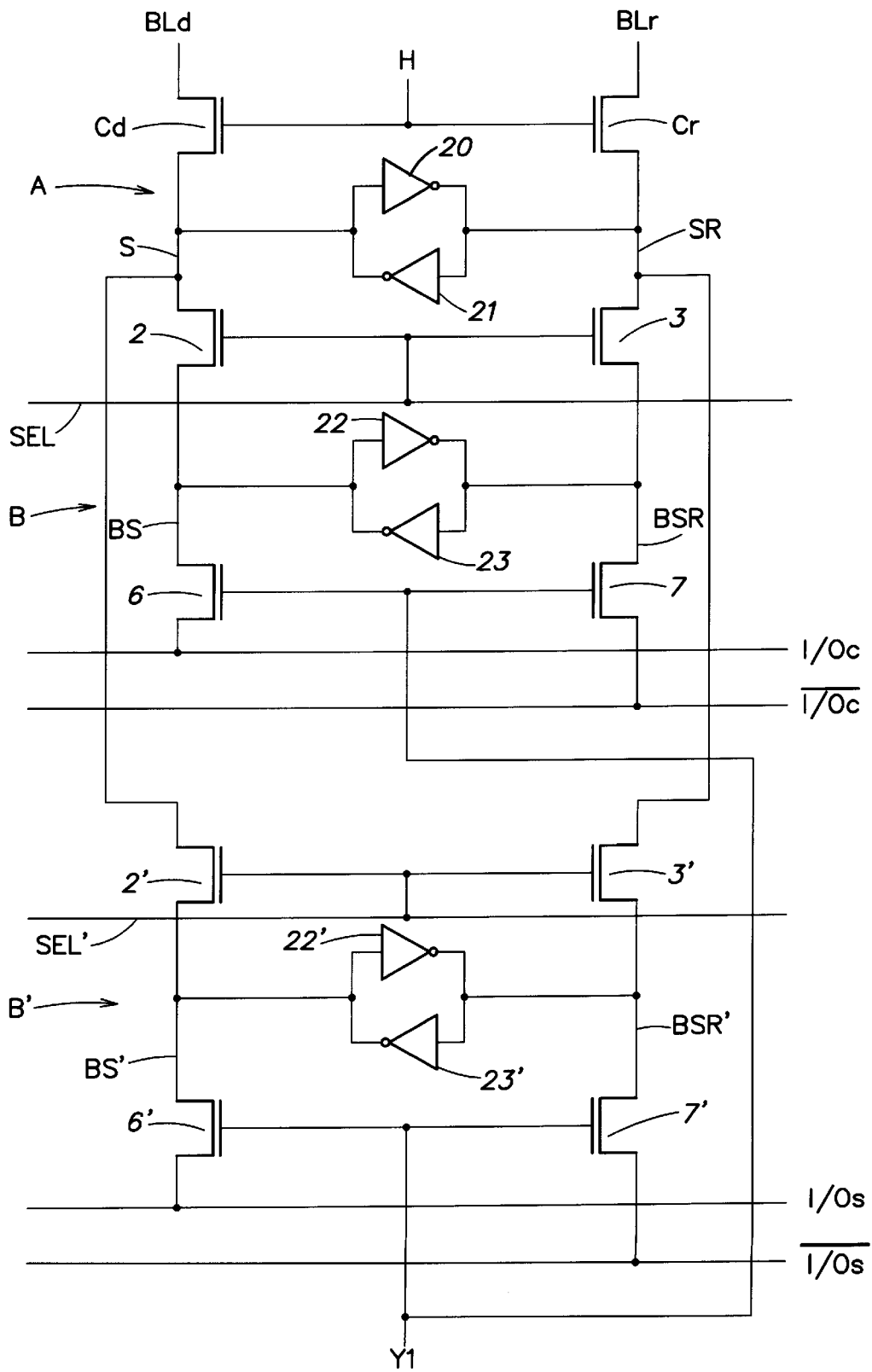
FIG. 2 shows in more detail a bit line reading element of the memory circuit shown in FIGS. 1A and 1B.

FIG. 2 shows a read amplifier A connected to an end of a bit line BL via a switch C, and associated with two latches B and B'. A bit line is formed of a direct bit line $BL_d$ and a so-called complementary reference bit line $BL_r$. Switch C is formed of a switching element $C_d$ on line $BL_d$ and of a complementary switching element $C_r$ on line $BL_r$. Switching elements 3, 3', 7 and 7' process the complementary signals of the signals crossing switching elements 2, 2', 6 and 6'. Signals $\overline{I/O_c}$ and $\overline{I/Os}$ are the complementary signals of signals $I/O_c$ and $I/O_s$ described in relation with FIGS. 1A and 1B.

As can be seen in FIG. 2, a read amplifier A generally is formed of two inverters 20, 21 connected in antiparallel between complementary bit lines $BL_d$, $BL_r$. According to an embodiment of the present invention, each latch B also comprises a pair of inverters 22, 23 connected in antiparallel between two complementary bit lines BS and BSR. Similarly, each latch B' includes two inverters 22', 23' connected in antiparallel between two complementary bit lines BS', BSR'. Thus, each latch B, B' has a structure similar to that of a read amplifier. Therefore, as previously indicated, inverters 20, 21 may be omitted, provided that the inverters of latches B and B' are adapted to be able to load the bit lines.

In the embodiment shown in FIG. 2, the different switching elements are formed by means of MOS transistors. The transistors constitutive of switching elements $C_d$, $C_r$ have their gates interconnected, said gates receiving abovementioned signal H. The transistors constitutive of switching elements 2, 3, have their gates connected together to the output of an element 10 (FIGS. 1A and 1B) these gates receiving a signal SEL. These transistors are interposed between the pair of inverters 20, 21 of the read amplifier and the pair of inverters 22, 23 of latch B. The transistors constitutive of switching elements 6, 7 are respectively interposed between the pair of inverters 22, 23 constitutive of latch B and lines $I/O_c$, $\overline{I/O}c$. The transistors constitutive of switching elements 2', 3' are controlled by signal SEL', their respective gates being connected to the output of element 10'. These transistors are interposed between the pair of inverters 20, 21 of the read amplifier and the pair of inverters 22', 23' of latch B'. The transistors constitutive of switching elements 6', 7' are respectively interposed between the pair of inverters 22', 23' constitutive of latch B' and lines $I/O_S$, $\overline{I/O}_s$. The gates of the transistors constitutive of elements 6, 7, 6', 7' are all controlled by the column selection signal (for example, $Y_1$.

Of course, the present invention is likely to have various alterations, modifications, and improvements which will readily occur to those skilled in the art. In particular, the practical implementation of the state machines necessary for the control of the memory circuit is within the abilities of those skilled in the art based on the functional indications given hereabove. Further, other switching or temporary storage elements such as, respectively, transistors or inverters, may be used provided that they respect the previously-discussed functional characteristics.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A DRAM circuit including a plurality of memory cells organized in an array, including switches for connecting each end of each column of the array with at least two latches, controlled independently from each other to store data written into or read from the column to which the at least two latches are connected, wherein the latches are organized in two pairs of sets, each set being associated with a register for storing the row address of the data contained in this latch set.

2. The memory circuit of claim 1, wherein the two pairs of sets of latches are respectively connected to a first and a second pair of input/output lines adapted to being separately connected to a first and to a second input/output terminal of the memory circuit.

3. The memory circuit of claim 1, wherein so that the access to the array for a latch set is performed simultaneously for all latches in the set.

4. The memory circuit of claim 1, wherein the access to the data contained in a latch set from outside the circuit is performed individually, each latch in a same set being individually selected by a memory cell column addressing signal.

5. The memory circuit of claim 1, including, associated with each latch set, a comparator of the address contained in the associated address register, with an address provided by a row address bus.

6. The memory circuit claim 1, including:

a first plurality of read amplifiers each arranged between a first respective switch and said at least two latches associated therewith, and a second plurality of read amplifiers each arranged between a second respective switch and said at least two latches associated therewith.

7. The memory circuit of claim 1, including a state machine adapted to successively address the different rows of the array.

8. The memory circuit of claim 2, wherein the first and second input/output terminals of the memory circuit are interconnected.

* * * * *

UNITED STATES PATENT AND TRADEMARK OFFICE
CERTIFICATE OF CORRECTION

PATENT NO. : 6,215,706 B1
DATED : April 10, 2001
INVENTOR(S) : Michel Harrand and Richard Ferrant Page 1 of 1

It is certified that error appears in the above-identified patent and that said Letters Patent is hereby corrected as shown below:

<u>Title page,</u>
Item [56] should read:

[56] References Cited
U.S. PATENT DOCUMENTS

| | | | |
|---|---|---|---|
| 4,649,516 | 03/10/87 | Chung et al. | 364/900 |
| 5,625,594 | 04/29/97 | Choi et al. | 365/189 |
| 5,444,652 | 08/22/95 | Furuyama | 365/149 |
| 5,432,733 | 07/11/95 | Furuyama | 365/149 |
| 5,226,147 | 07/06/93 | Fuishima et al. | 395/425 |
| 4,442,160 * | 12/1983 | Watanabe | 365/235 |

Signed and Sealed this

Fourth Day of December, 2001

Attest:

NICHOLAS P. GODICI
*Attesting Officer*     *Acting Director of the United States Patent and Trademark Office*